(12) United States Patent
Chang (10) Patent No.: US 8,137,895 B2
(45) Date of Patent: Mar. 20, 2012

(54) STRUCTURE AND METHOD FOR IMPROVING PHOTORESIST PATTERN ADHESION

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 11/427,721

(22) Filed: Jun. 29, 2006

(65) Prior Publication Data

US 2007/0037089 A1    Feb. 15, 2007

Related U.S. Application Data

(60) Provisional application No. 60/706,845, filed on Aug. 9, 2005.

(51) Int. Cl.
*G03F 7/11* (2006.01)
(52) U.S. Cl. ............ 430/271.1; 430/270.1; 430/273.1
(58) Field of Classification Search ............ 430/270.1, 430/271.1, 273.1
See application file for complete search history.

(56) References Cited

U.S. PATENT DOCUMENTS

| | | | | |
|---|---|---|---|---|
| 3,895,946 | A * | 7/1975 | Kubotera et al. ............ | 430/302 |
| 4,362,809 | A | 12/1982 | Chen et al. | |
| 4,370,405 | A | 1/1983 | O'Toole et al. | |
| 4,910,122 | A | 3/1990 | Arnold et al. | |
| 5,648,195 | A * | 7/1997 | Sebald et al. ............ | 430/170 |
| 5,851,730 | A | 12/1998 | Thackeray et al. | |
| 5,851,738 | A | 12/1998 | Thackeray et al. | |
| 5,886,102 | A | 3/1999 | Sinta et al. | |
| 5,939,236 | A | 8/1999 | Pavelchek et al. | |
| 6,455,223 | B1 * | 9/2002 | Hatakeyama et al. ..... | 430/270.1 |
| 6,512,084 | B2 * | 1/2003 | Puligadda et al. ............ | 528/423 |
| 6,534,235 | B1 * | 3/2003 | Hanabata et al. ............ | 430/191 |
| 6,767,689 | B2 | 7/2004 | Pavelcheck et al. | |
| 2002/0076642 | A1 * | 6/2002 | Zampini et al. ............ | 430/270.1 |
| 2002/0192594 | A1 * | 12/2002 | Enomoto et al. ............ | 430/271.1 |
| 2003/0203310 | A1 * | 10/2003 | Thackeray et al. ......... | 430/270.1 |
| 2005/0054216 | A1 * | 3/2005 | Daley ............................ | 438/781 |
| 2005/0106500 | A1 * | 5/2005 | Watanabe et al. ........... | 430/270.1 |
| 2006/0248665 | A1 * | 11/2006 | Pluyter et al. ..................... | 8/406 |

FOREIGN PATENT DOCUMENTS

TW    591071    6/2004

OTHER PUBLICATIONS

American Heritage Dictionary of English Language: Fourth Edition, 2000.*
Laura Peters, "Photoresists Meet the 193 nm Milestone", Semiconductor International, Feb. 1, 2005, www.reed-electronics.com/semiconductor/article/CA499681?industryid=3030; 8 pages.
Marc Weimer et al., "New Material for 193-nm Bottom Anti-Reflective Coatings", 2003 Society of Photo-Optical Instrumentation Engineers, 6 pages.
Chelladurai Devadoss et al., "Investigation of BARC-resist Interfacial Interactions", 2003 Society of Photo-Optical Instrumentation Engineers, 11 pages.
H. Ito, "Dissolution Behavior of Chemically am Resist Polymers for 248-, 193-, and 157-Lithography", Advanced Semiconductor Lithography, vol. 45, No. 5, 2001, www.research.ibm.com/journal/rd/455/ito.html. 10 pages.
H. Ito, "Chemical Amplification Resists: History and Development with IBM", www.research.ibm.com/journal/rd/411/ito.txt, 0018/8646/97, 1997 IBM, 12 pages.
Taiwanese Patent Office, Office Action issued Jul. 12, 2010, Application No. 095128204, 4 pages.

* cited by examiner

*Primary Examiner* — Anca Eoff
(74) *Attorney, Agent, or Firm* — Haynes and Boone, LLP (57) ABSTRACT

An anti-reflective coating comprises a plurality of main backbone chains, and at least one long free polymer chain coupled to at least one of the plurality of main backbone chains.

20 Claims, 9 Drawing Sheets

Acid Labile Unit

FIG. 5B

Polar Unit

MAdOH

FIG. 5E

MONL

STRUCTURE AND METHOD FOR IMPROVING PHOTORESIST PATTERN ADHESION

CROSS REFERENCES

The present application claims the benefit of U.S. Ser. No. 60/706,845, which was filed Aug. 9, 2005, and is hereby incorporated by reference.

BACKGROUND

As semiconductor device critical dimensions continue to shrink, optical lithography—the process by which material layers are removed or deposited as defined by using an optically developed photoresist pattern—encounters a serious problem commonly known as pattern collapse. Pattern collapse results when lateral capillary forces that impinge on adjacent photoresist lines during the develop and rinse steps overcome the mechanical and adhesive strength of the photoresist line with the substrate. The result is toppled photoresist lines and therefore improperly defined areas for material removal or deposition. Pattern collapse is especially significant when etching metal trenches where the resist aspect ratio (thickness to width) equals or exceeds 3:1.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
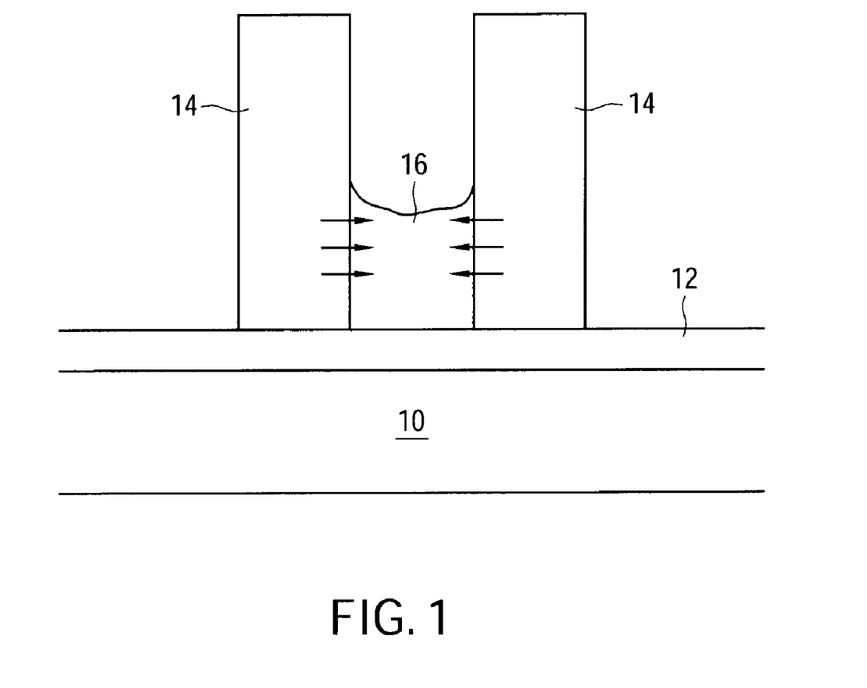
FIG. 1 is a simplified cross-sectional view of a semiconductor substrate.

FIG. 1 is a simplified cross-sectional view of a semiconductor substrate 10. Disposed above the semiconductor substrate 10 is an anti-reflective coating (ARC) or a bottom anti-reflective coating (BARC) layer 12. The BARC layer 12 is used to reduce the problem of reflected radiation at the interface between the highly-polished substrate 10 and the photoresist. The photoresist pattern 14 is developed after exposure to an activation radiation. By suppressing standing wave effects and reflective notching caused by reflected activation radiation, the use of the BARC layer 12 enhances the control of critical dimensions (CD) of semiconductor device features.

After photoresist development and rinse and during the drying process, a residual rinse liquid 16 such as de-ionized water remaining between the photoresist patterns 14 causes lateral forces such as capillary forces (indicated by the arrows) to pull on the photoresist lines 14. In cases where the photoresist lines are closely and densely spaced and/or where the photoresist aspect ratio is equal to or larger than 3:1, photoresist pattern collapse becomes a serious problem.

Figure 2:
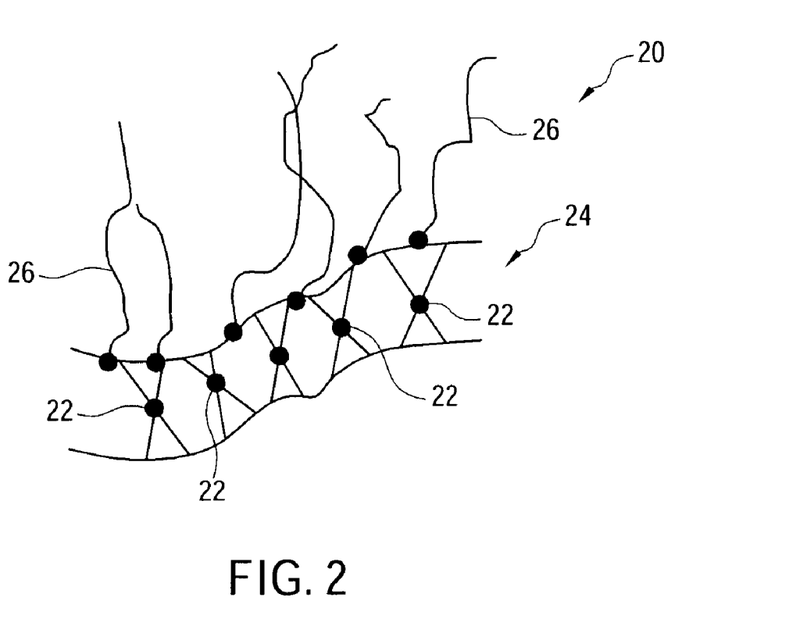
FIG. 2 is a simplified diagram of a polymer with cross-link members and long free polymer chains.

FIG. 2 is a simplified diagram of a representation of a BARC polymer 20 that may be used to overcome the problem of photoresist pattern collapse. The BARC polymer 20 comprises crosslinkers 22 forming a main backbone chain 24 and a plurality of long free polymer chains 26 coupled to the main backbone chain 24. The long free polymer chains 26 are generally absent of crosslinkers and are capable of extending into the photoresist layer. The presence of a plurality of long free polymer chains 26 strengthens the van der waal forces between the photoresist and the BARC layers, which increases the adhesion of the photoresist to the BARC layer. This in turn reduces the likelihood of photoresist pattern collapse during the drying process.

The long free polymer chains 26 may comprise functional groups coupled to the polymer main backbone chain. The long free polymer chains 26 may comprise materials selected from groups IV, V, VI, VII of the Periodic Table and the element Hydrogen. The long free polymer chains 26 may each contain at least three carbon atoms.

Figure 3:
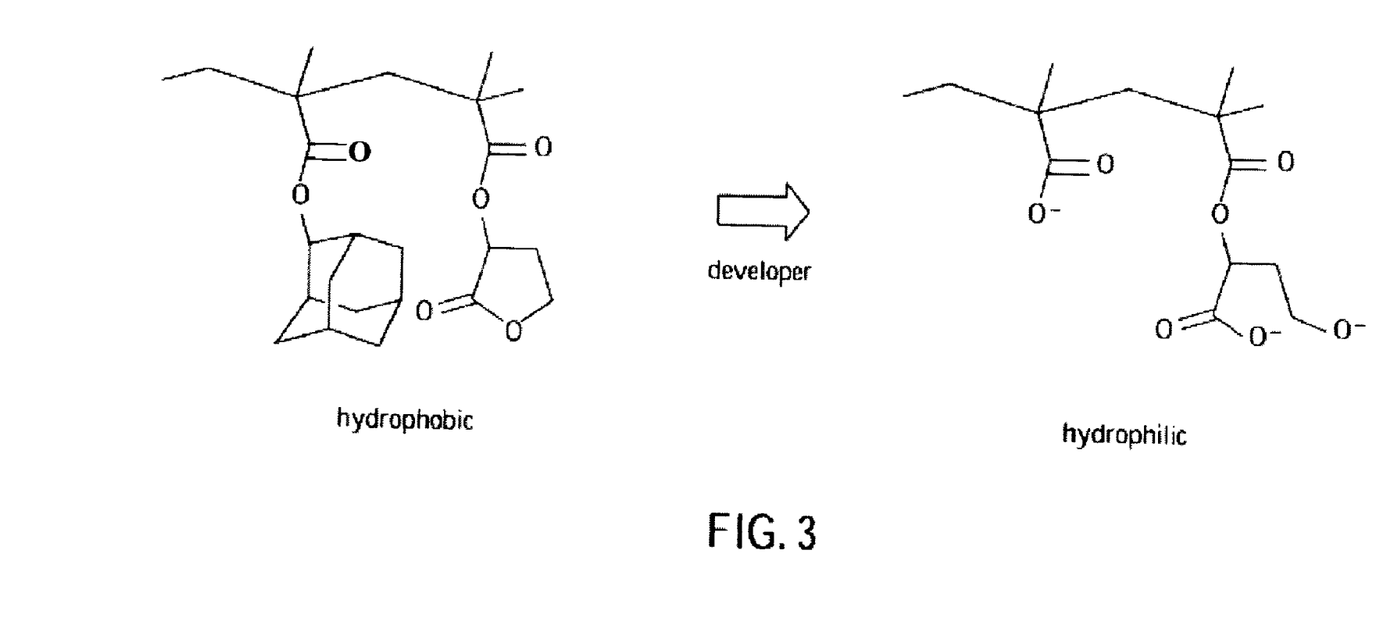
FIG. 3 is a diagram illustrating a chemical process.

FIG. 3 is a diagram illustrating a chemical process in which an acrylate-based polymer, shown here coupled to a lactone, form at least a portion of a BARC polymer 12 (FIG. 1) that is not covered by the photoresist 14 (FIG. 1). This acrylate-based polymer is generally hydrophobic. When reacting with acid from photoresist 14 and after post exposurebaking, the acid labile functional groups of the BARC polymer become decoupled from the polymer chain. Since the remaining polymer chain contains more carboxylic group and hydroxyl group after tetramethylammonium hydroxide (TMAH) developing. The BARC polymer in exposed area thus becomes hydrophilic in nature. The result is that the contact angle of any liquid on the surface of the BARC layer decreases, which reduces water mark and defect formation.

Figure 4A:
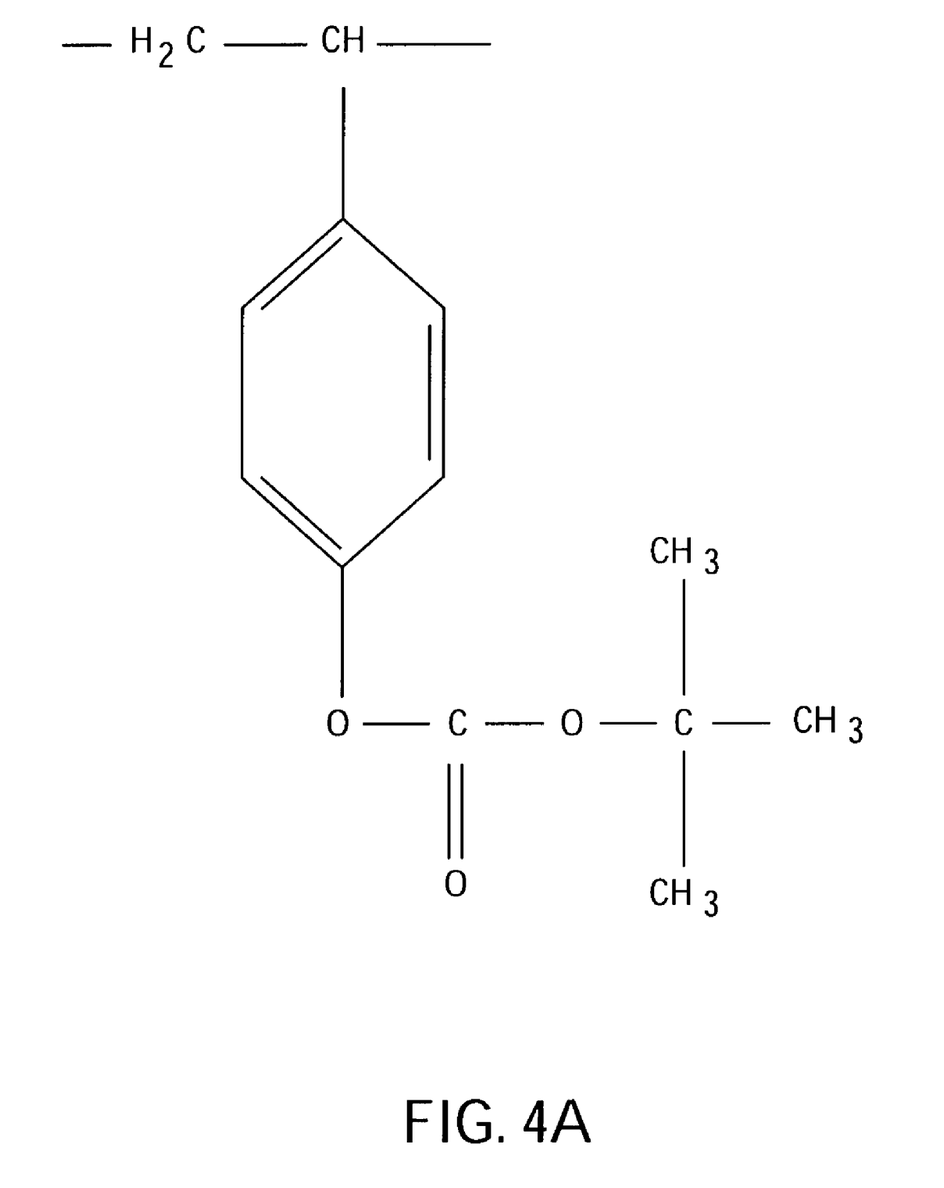
FIG. 4A-4C are exemplary chemical formulas of KrF polymer candidates with long free polymer chains.
Figure 4B:
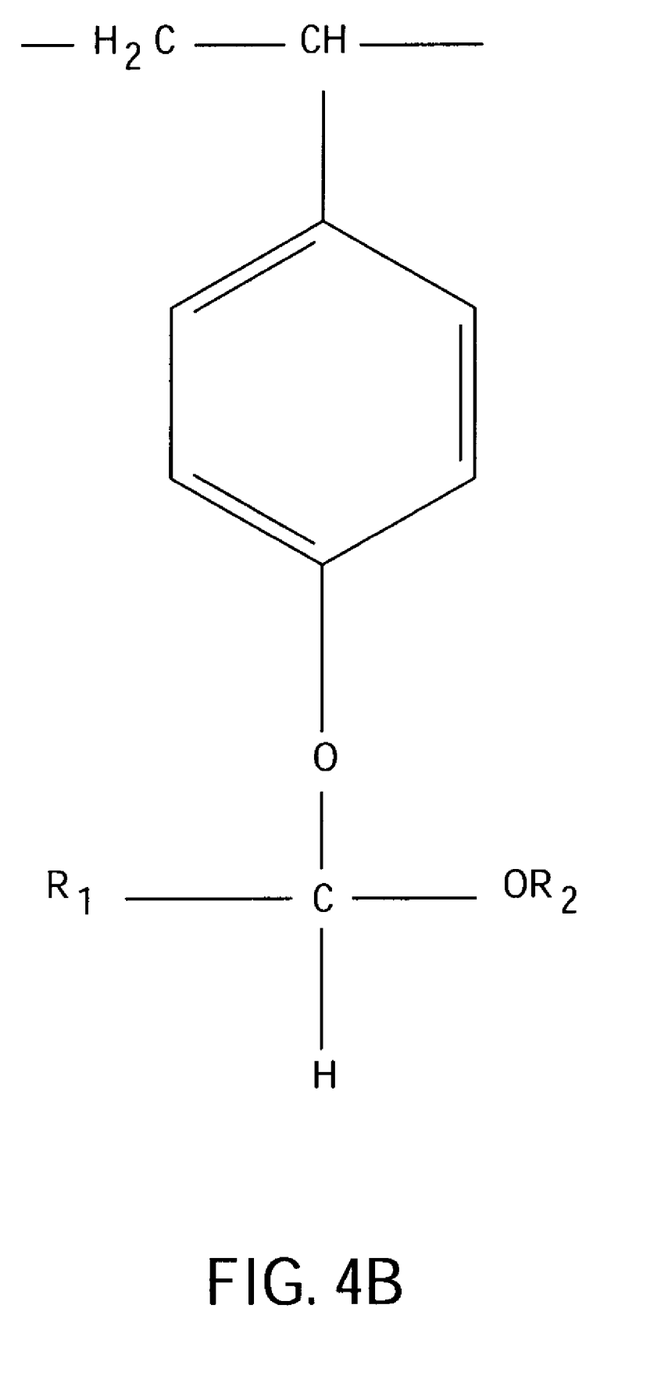
Figure 4C:
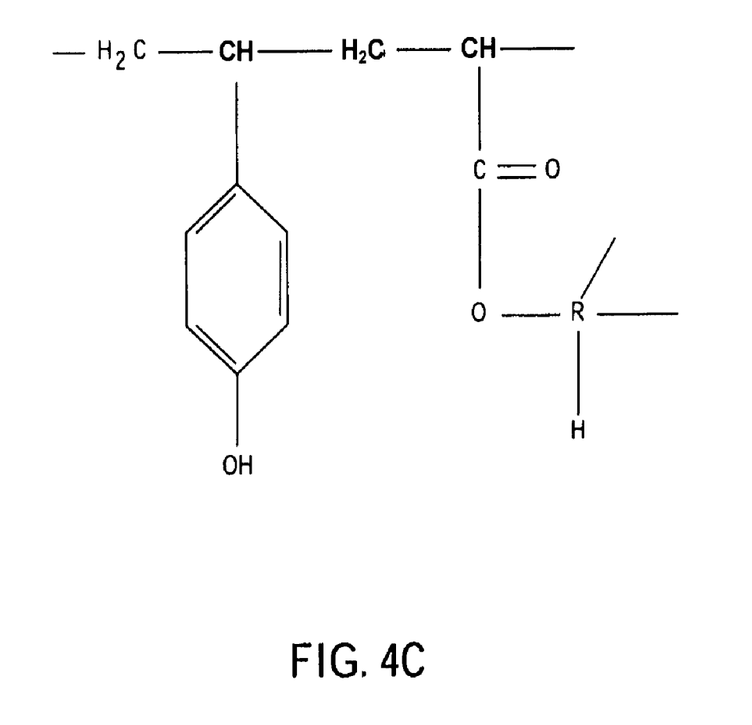

The long free polymer chain may contain a pure polymer structure or include acid labile functional groups from a photoresist polymer adapted for a KrF (krypton fluoride) excimer laser (248 nm) and/or a polymer adapted for an ArF (argon fluoride) excimer laser (193 nm), for example. FIGS. 4A-4C are exemplary chemical formulas of KrF polymers. The BARC polymers may include deep ultraviolet (DUV) photoresist polymers such as t-BOC (t-butoxycarbonyl) (FIG. 4A), acetal-based (FIG. 4B), a metacrylate-based polymer, and ESCAP (environmentally stable chemically amplified positive) (FIG. 4C, where R may be an alkyl group of any composition, such as methyl, ethyl, propyl, or other ring type polymer) polymers, for example. These polymers comprise a main backbone chain of —$CH_2$—$CH_2$— units coupled to long free polymer chains that are capable of extending into the photoresist layer and improve adhesion between the layers.

A simplified chemical formula of an KrF polymer with long free polymer chains is shown below.

The KrF polymer may comprise a main backbone chain that primarily include carbon and hydrogen molecules. Functional groups X and Y indicate that different long free polymers may be coupled to the main backbone chain. The functional groups preferably each includes at least three carbon atoms and are generally free of crosslinkers. The functional groups X and Y may also indicate different acid leaving group and polar group as illustrated in FIG. 3. The functional groups may change from hydrophobic to hydrophilic after exposed and developed with TMAH solution.

FIGS. 5A-5I are exemplary chemical formulas of ArF polymer candidates with long free polymer chains. These polymers may comprise a main backbone chain of —CH$_2$—CH$_2$— units coupled to long free polymer chains that are capable of extending into the photoresist layer and improve adhesion between the layers.

A simplified chemical formula of an ArF polymer with long free polymer chains is shown below.

Figure 5A:
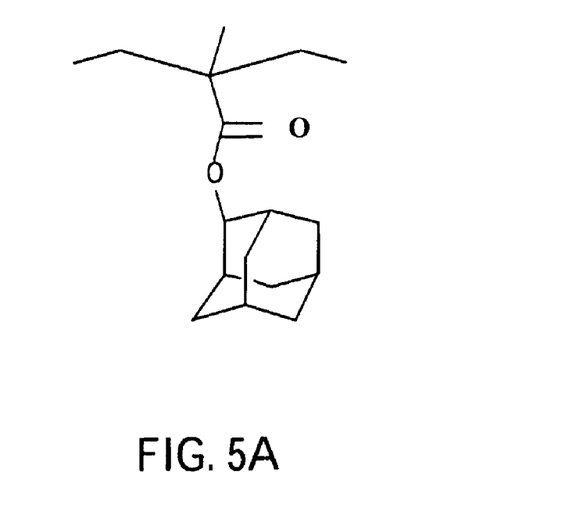
FIG. 5A-5I are exemplary chemical formulas of ArF polymer candidates with long free polymer chains.
Figure 5B:
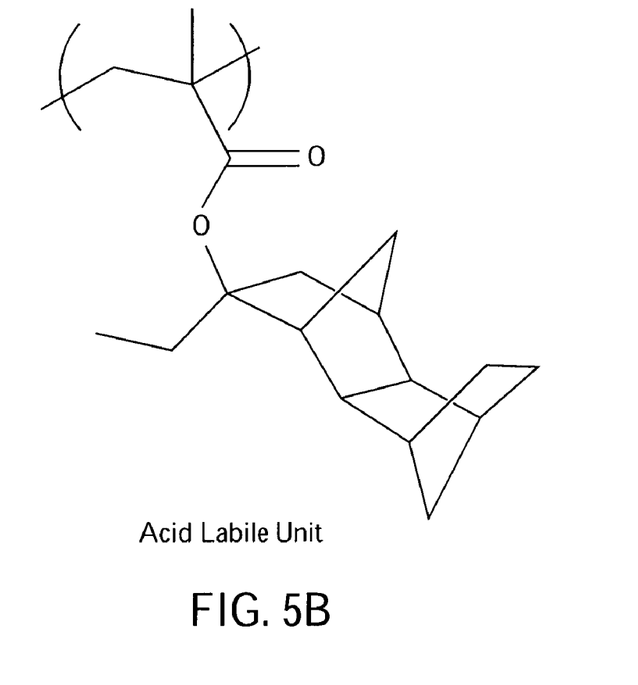

An acrylate-based monomer, shown in FIG. 5A, may be coupled with a variety of other monomers shown in FIGS. 5B-5I to form the BARC polymer. In FIG. 5B, an acid labile unit is shown that may be coupled to the acrylate-based monomer to form the BARC polymer. The acid labile unit comprises an acid cleavable group that are lost when exposed to acids. Therefore, a BARC polymer comprising the acid labile unit in the areas uncovered by the photoresist layer can be treated with acid to make it more hydrophilic. The hydrophilic nature of the exposed BARC decreases its contact angle in the exposed areas and in turn helps to reduce water mark and defect formation.

Figure 5C:
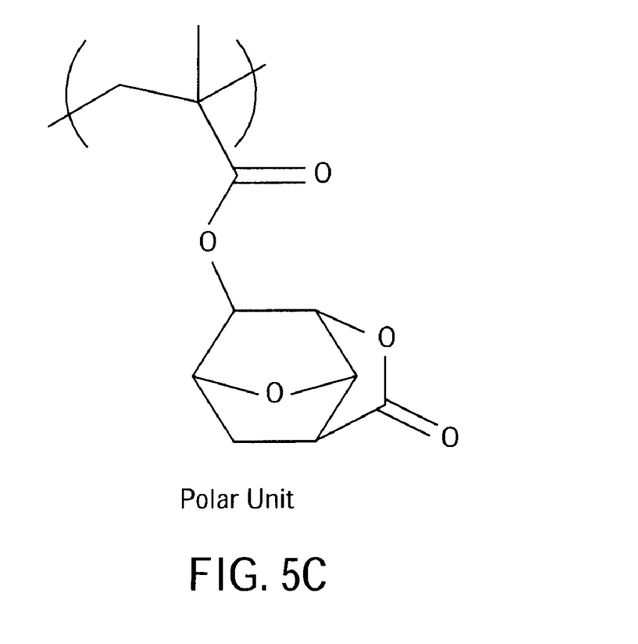

In FIG. 5C, a polar unit is shown that may be coupled to the acrylate-based monomer to form the BARC polymer. The polar unit, when exposed to a developer, for example, becomes a COOH group coupled to the main backbone chain, and changes its polarity. Therefore, a BARC polymer comprising the polar unit in the areas uncovered by the photoresist layer becomes more hydrophilic. The hydrophilic nature of the exposed BARC decreases the contact angle in the exposed areas and in turn helps to reduce water mark and defect formation.

Figure 5D:
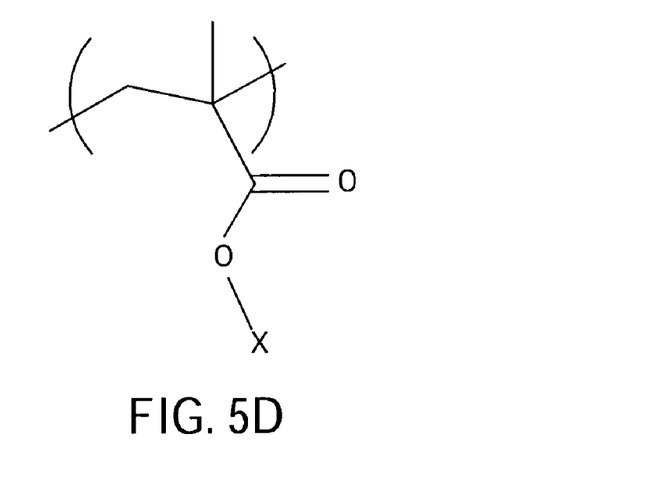
Figure 5E:
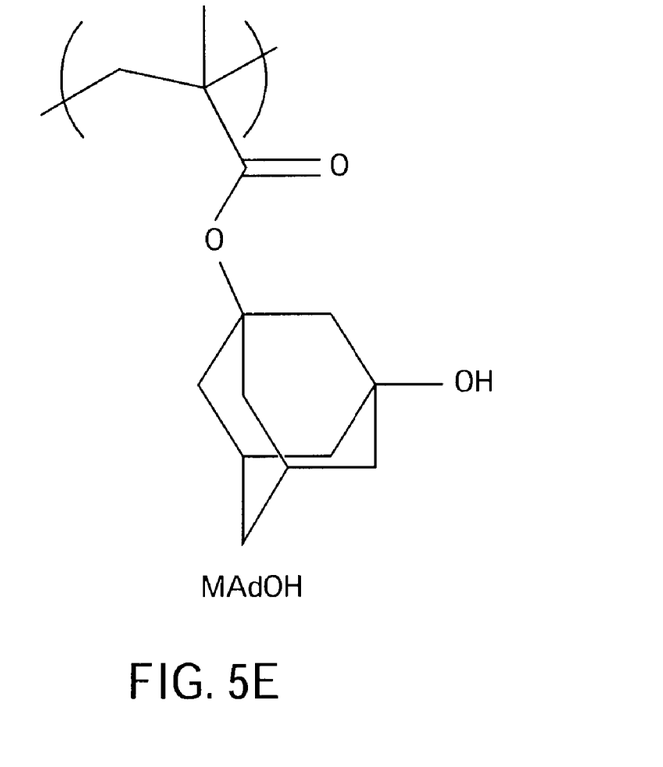
Figure 5F:
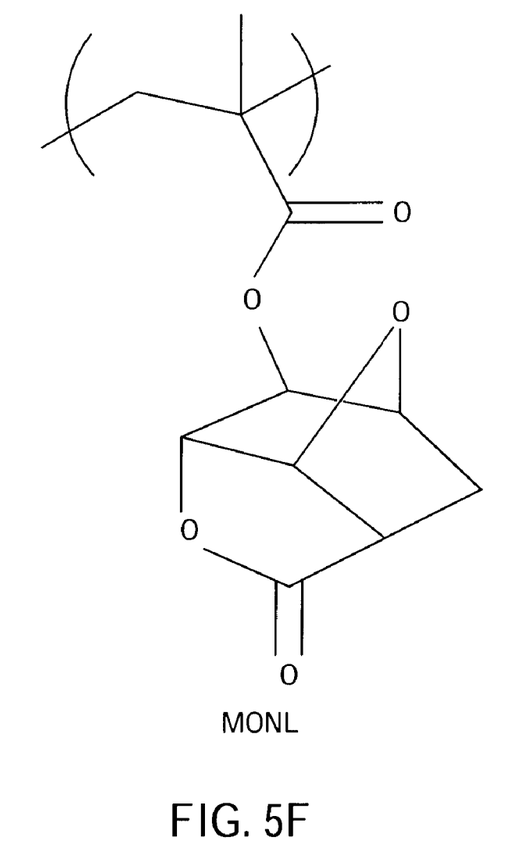
Figure 5G:
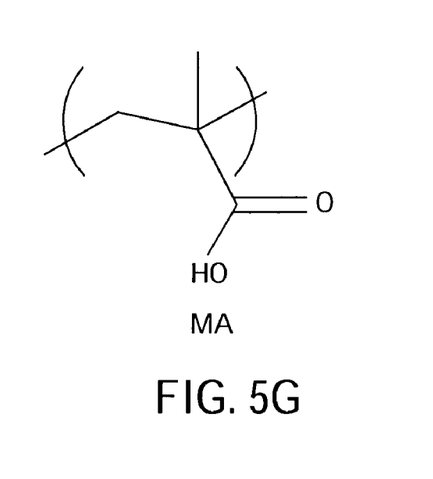

FIGS. 5D (where X may represent a single functional group), 5E, 5F, and 5G are additional examples of monomers comprising functional groups that may be lost when treated in a certain manner to decrease the contact angle and reduce water mark and defect formation.

Figure 5H:
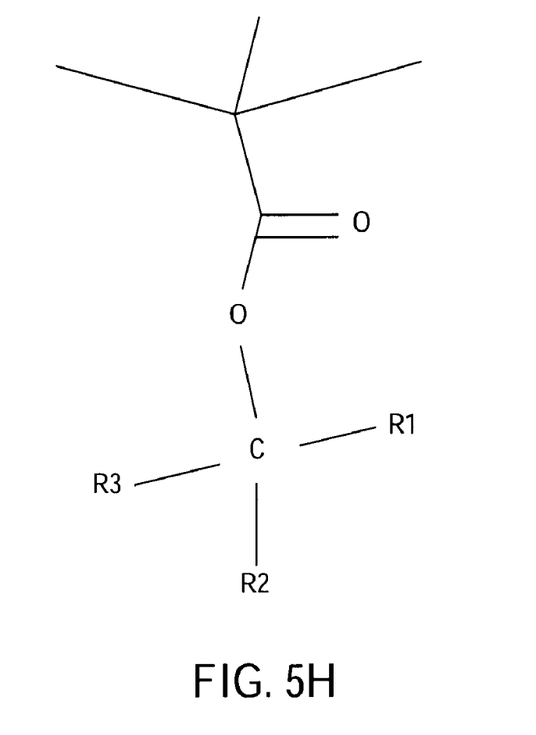

FIG. 5H shows an acid labile unit that may be coupled to the acrylate-based monomer to form the BARC polymer. The acid labile unit comprises an acid cleavable group. The acid labile group includes a tert-alkyl structure. The R1 to R3 alkyl group bonding to the carbon may compose of methyl, ethyl, ethyl, or other ring type polymer. The R1 to R3 alkyl group may be same or different in composition.

Figure 5I:
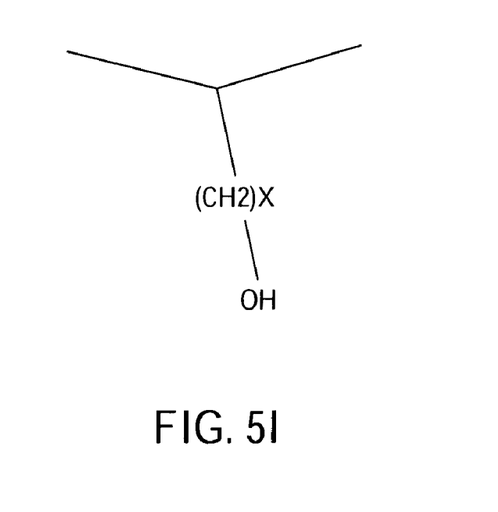

FIG. 5I shows another polar unit that may be coupled to the acrylate-based monomer to form the BARC polymer. The polar unit, when exposed to a developer for example, becomes a RO— group coupled to the main backbone chain, and changes its polarity. Therefore, a BARC polymer having the polar unit in the areas uncovered by the photoresist layer becomes more hydrophilic. The X unit may range about 0 to 10. For example, the X unit may be 2 in one embodiment.

The ArF BARC polymers not only comprise long free chains that may extend into the overlying photoresist to increase the adhesion therebetween, but the BARC polymers exposed during processing of the photoresist become hydrophilic. The hydrophilic nature of the exposed BARC polymers decreases the contact angle with respect to surface liquids to discourage the formation of water marks and other defects on the surface of the BARC layer.

In another embodiment, the BARC polymer may also contain at least one functional group similar to that in the photoresist layer overlying the BARC layer. The BARC functional group may be coupled to the long free polymer chain or to the main backbone chain. The similarity of the functional groups enhances the affinity of the two materials at their interfaces and therefore increases adhesion between the two layers.

In a further embodiment, the BARC layer may comprise a predetermined amount of polymers or non crosslinked polymer that are susceptible to removal by one or more treatment steps prior to the application or formation of the photoresist layer over the BARC layer. A solvent or another solution may be used to treat the BARC layer, resulting in the loss of certain polymers from the BARC material. This treatment step produces a BARC surface that may be slightly roughened. Thereafter, the formation of the photoresist layer over the BARC surface increases the surface area to which the photoresist may adhere to and thus increasing the overall adhesion between the two layers.

In another embodiment, the BARC layer may contain less crosslinking units, which make the BARC polymer less resistant to the photoresist layer. Such intermixing between the BARC layer and resist layer may make the exposed area more hydrophilic. The adhesion in unexposed area will be enhanced due to polymer intermixing and bonding. The less crosslinked BARC layer also make the polymer structure less rigid, rough, or porous during solvent rinsing or resist coating, thus enhancing the resist adhesion. The less crosslinked BARC may be achieved by various methods such as reducing the BARC crosslinker, reducing backbone polymer crosslinking units, or lowering the baking temperature.

In general, the BARC or ARC material described herein comprises a main backbone chain with a plurality of long free polymer chains coupled thereto. The long polymer chains are capable of extending into the photoresist layer overlying the BARC layer, thus strengthening the bond and adhesion between the BARC and the photoresist. The increased adhesion leads to a reduction in the occurrence of photoresist collapse. Further, the BARC material may comprise long free polymer chains with functional groups that may be decoupled when exposed to a developer or other substances. The resultant BARC material is generally hydrophilic, which results in smaller contact angles between liquids (such as deionized rinse water) and the surface of the BARC material, and the reduction in the formation of water marks and other defects.

Thus, the present disclosure provides an anti-reflective coating (ARC). The ARC includes a plurality of main backbone chains; and at least one long free polymer chain coupled to at least one of the plurality of main backbone chains.

In the anti-reflective coating, the plurality of main backbone chains may includes crosslinkers. The at least one long free polymer chain may be generally free of crosslinkers. The at least one long free polymer chain may include at least three carbons. The at least one long free polymer chain may include at least one acid-labile functional group which becomes labile when reacting with acid. The at least one main backbone chain may include at least one acid labile functional group which becomes labile when reacting with acid. The anti-reflective coating may further include an acid labile functional group coupled to the at least one long free polymer chain, the acid labile functional group being the same as an acid group functional group found in a photoresist disposed above the anti-reflective coating. The at least one long free polymer chain may include a polymer selected from a group consisting of a KrF polymer and an ArF polymer. The at least one long free polymer chain may include at least one acid labile functional group that becomes decoupled from the main backbone chain after reacting with acid and causing the anti-reflective coating to become hydrophilic after post exposure baking and development. The at least one long free polymer chain may include at least one acid cleavable group that becomes decoupled from the main backbone chain after treatment with an acid and causing the anti-reflective coating to become hydrophilic. The anti-reflective coating may further include a polymer that becomes decoupled from the main backbone chain after treatment with a predetermined substance and causing the anti-reflective coating to have a roughened surface for better adhesion with a photoresist layer formed over the anti-reflective coating.

The present disclosure also provides a method of improving photoresist adhesion. The method includes forming, on a substrate, an anti-reflective coating having a plurality of main backbone chains each with at least one long free polymer chain coupled to each of the plurality of main backbone chains; and forming a photoresist layer on the anti-reflective coating, the at least one long free polymer chain of the anti-reflective coating extending into the photoresist layer.

In the method, the forming of the anti-reflective coating may include providing the plurality of main backbone chains with crosslinkers. The forming of the anti-reflective coating may include providing the at least one long free polymer chain generally free of crosslinkers. The forming of the anti-reflective coating may include providing the at least one long free polymer chain with at least three carbons. The forming of the at least one long free polymer chain may include forming at least one acid labile functional group which becomes labile when reacting with acid.

The present disclosure also provides a semiconductor device. The semiconductor device includes an anti-reflective coating disposed above a substrate having a plurality of main backbone chains each with at least one acid labile functional group coupled to each of the plurality of main backbone chains; and the plurality of main backbone chains having a plurality of crosslinkers.

In the semiconductor device, the acid labile functional group may become labile when reacting with acid. The acid labile functional group may be the same as an acid labile functional group found in a photoresist disposed above the anti-reflecting coating. The at least one acid labile functional group may include a polymer selected from a group consisting of a KrF polymer and an ArF polymer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claim claims are intended to include within their scope such processes, machines, manufacture, compositions of matter, means, methods, or and steps.

What is claimed is:

1. A device, comprising:
   an anti-reflective coating; and
   a photoresist layer having an interface with the anti-reflective coating, wherein the anti-reflective coating includes:
   a plurality of main backbone chains having crosslinkers between parallel polymer chains; and
   a first long free polymer chain coupled to and extending from one of the main backbone chains, wherein the first long free polymer chain includes a polymer chain having at least three carbons and a first functional group attached to the polymer chain of the first long free polymer chain, the first long free polymer chain extending into the photoresist layer, the first functional group being one of an acid functional group and a polar functional group.

2. The device of claim 1, wherein the first functional group is an acid functional group which becomes labile when reacting with acid.

3. The device of claim 1, wherein at least one main backbone chain comprises at least one acid labile functional group which becomes labile when reacting with acid.

4. The device of claim 1, wherein the first functional group is a polar functional group which becomes more hydrophilic when reacting with acid or TMAH developer.

5. The device of claim 1, wherein at least one main backbone chain comprises at least one polar functional group which becomes more hydrophilic when reacting with acid or TMAH developer.

6. The device of claim 1, wherein the first functional group is an acid functional group the same as an acid functional group found in the photoresist layer.

7. The device of claim 1, wherein the first long free polymer chain comprises a polymer selected from a group consisting of a KrF polymer and an ArF polymer.

8. The device of claim 1, wherein the first functional group is an acid functional group that becomes decoupled from the long free polymer chain after reacting with acid and causing the anti-reflective coating to become hydrophilic after post exposure baking and development.

9. The device of claim 1, wherein the first functional group is an acid functional group that becomes decoupled from the long free polymer chain after treatment with an acid and causing the anti-reflective coating to become hydrophilic.

10. The device of claim 1, wherein the anti-reflective coating further includes a polymer that becomes decoupled from the plurality of main backbone chains after treatment with a predetermined substance and causing the anti-reflective coating to have a roughened surface for better adhesion with the photoresist layer, wherein the photoresist layer is formed over the anti-reflective coating.

11. The device of claim 1, wherein the first functional group is the same as a functional group of the photoresist layer.

12. A semiconductor device, comprising:
   an anti-reflective coating disposed on a substrate and having a main backbone chain that includes crosslinkers, wherein a first long free polymer chain and a second long free polymer chain are coupled to the main backbone chain and include a polymer structure having at least three carbon atoms and at least one functional group coupled to each polymer structure; and
   a layer of photoresist on the anti-reflective coating, wherein the first long free polymer chain extends into the layer of photoresist and wherein at least one of the at least one functional group coupled to each polymer structure is the same as a functional group found in the photoresist.

13. The semiconductor device of claim 12, wherein at least one of the at least one functional group coupled to each polymer structure comprise an acid labile functional group which becomes labile when reacting with acid.

14. The semiconductor device of claim 12, wherein at least one of the at least one functional group coupled to each polymer structure comprise a polar functional group which becomes more hydrophilic when reacting with acid or TMAH developer.

15. The semiconductor device of claim 12, wherein the main backbone chain comprises at least one polar functional group which becomes more hydrophilic when reacting with acid or TMAH developer.

16. A semiconductor device comprising:
an anti-reflective coating disposed above a substrate and including:
   a plurality of main backbone chains;
   a plurality of crosslinkers;
   a first acid labile functional unit coupled to the plurality of main backbone chains, wherein the first acid labile functional unit makes the anti-reflective coating hydrophilic; and
   at least one long free polymer chain coupled to the plurality of main backbone chains, wherein the at least one long free polymer chain is a polymer having at least three carbons; and
a photoresist layer disposed above the anti-reflective coating and including a greater plurality of crosslinkers than the anti-reflective coating layer and at least one functional group that is the same as the first acid labile functional unit of the anti-reflective coating, and wherein the at least one long free polymer chain extends into the photoresist layer.

17. The semiconductor device of claim 16, wherein the anti-reflective coating becomes hydrophilic when an acid cleavable group decouples from the first acid labile functional unit when reacting with acid.

18. The semiconductor device of claim 16, wherein the first acid labile functional unit comprises a polymer selected from a group consisting of a KrF polymer and an ArF polymer.

19. The semiconductor device of claim 16, wherein at least one main backbone chain comprises at least one polar functional group which becomes more hydrophilic when reacting with acid or TMAH developer.

20. The semiconductor device of claim 16, wherein the plurality of main backbone chains includes the plurality of crosslinkers.

* * * * *